(12) United States Patent
Jones

(10) Patent No.: US 9,083,038 B2
(45) Date of Patent: Jul. 14, 2015

(54) BATTERY CELL TERMINAL QUICK CONNECT CLAMP WITH CONNECTING TAB

(71) Applicant: Liebert Corporation, Columbus, OH (US)

(72) Inventor: James R. Jones, Boca Raton, FL (US)

(73) Assignee: Liebert Corporation, Columbus, OH (US)

( * ) Notice: Subject to any disclaimer, the term of this patent is extended or adjusted under 35 U.S.C. 154(b) by 92 days.

(21) Appl. No.: 14/049,267

(22) Filed: Oct. 9, 2013

(65) Prior Publication Data

US 2014/0113506 A1    Apr. 24, 2014

Related U.S. Application Data

(60) Provisional application No. 61/716,745, filed on Oct. 22, 2012.

(51) Int. Cl.
*H01R 4/28* (2006.01)
*H01M 2/20* (2006.01)
*H01R 11/28* (2006.01)
*G01R 31/36* (2006.01)
*H01M 2/30* (2006.01)

(52) U.S. Cl.
CPC ........... *H01M 2/206* (2013.01); *G01R 31/3637* (2013.01); *G01R 31/3696* (2013.01); *H01R 11/282* (2013.01); *H01M 2/305* (2013.01)

(58) Field of Classification Search
CPC ..................................................... H01R 4/4863
USPC .......... 439/725, 726, 773, 769, 770, 777, 772
See application file for complete search history.

(56) References Cited

U.S. PATENT DOCUMENTS

| | | | |
|---|---|---|---|
| 1,528,508 A | 3/1925 | Ratsch | |
| 3,488,627 A * | 1/1970 | Martinez | ........................ 439/761 |
| 5,314,342 A | 5/1994 | Figge | |
| 6,802,747 B1 | 10/2004 | Orange | |
| 7,354,319 B2 * | 4/2008 | Camino et al. | ................. 439/828 |

OTHER PUBLICATIONS

International Search Report and Written Opinion for PCT/US2013/063985 mailed Dec. 20, 2013.

* cited by examiner

*Primary Examiner* — Phuong Dinh
(74) *Attorney, Agent, or Firm* — Harness, Dickey & Pierce, P.L.C.

(57) ABSTRACT

A battery cell terminal quick connect clamp for attaching to a battery cell terminal has a conductive contact coupled to a connecting element to which a connector attached to the end of a battery monitoring lead can attach. The quick connect clamp includes a clamping mechanism that when in a clamped position presses the conductive contact against a side of the battery cell terminal.

6 Claims, 4 Drawing Sheets

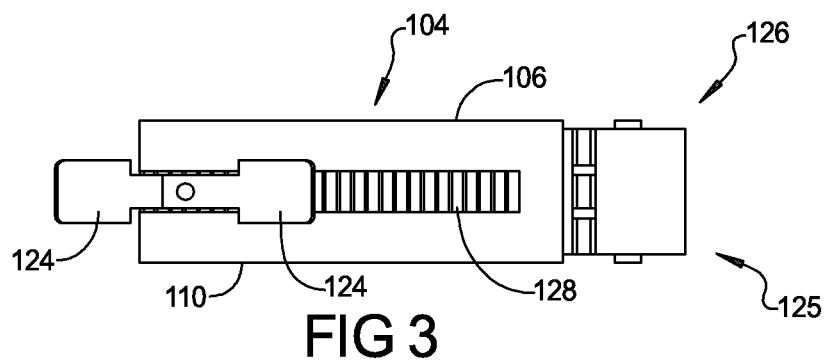
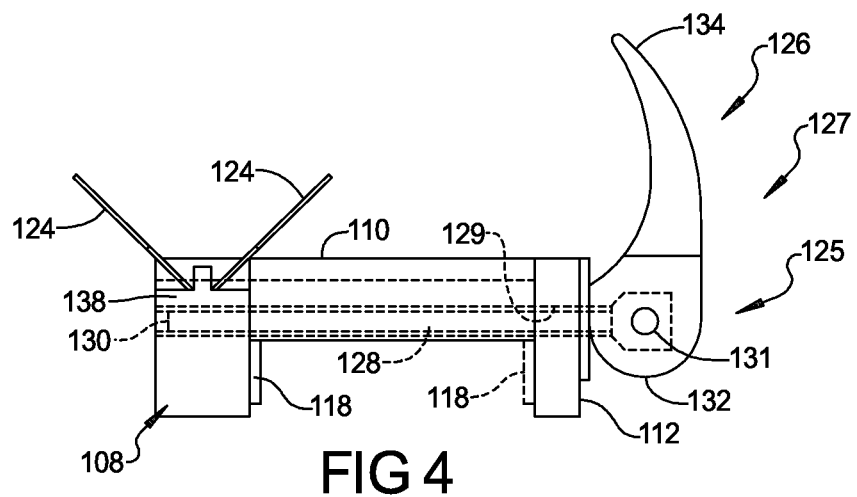
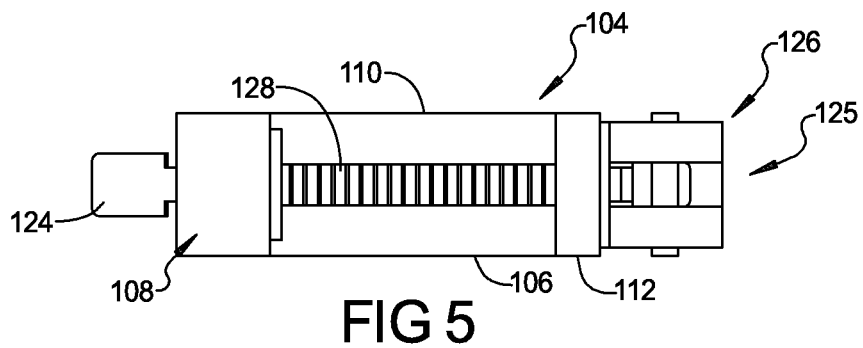

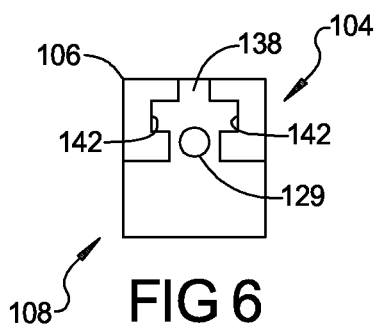
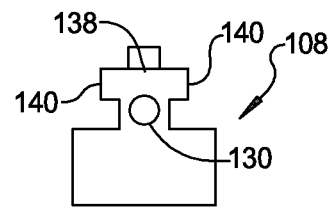
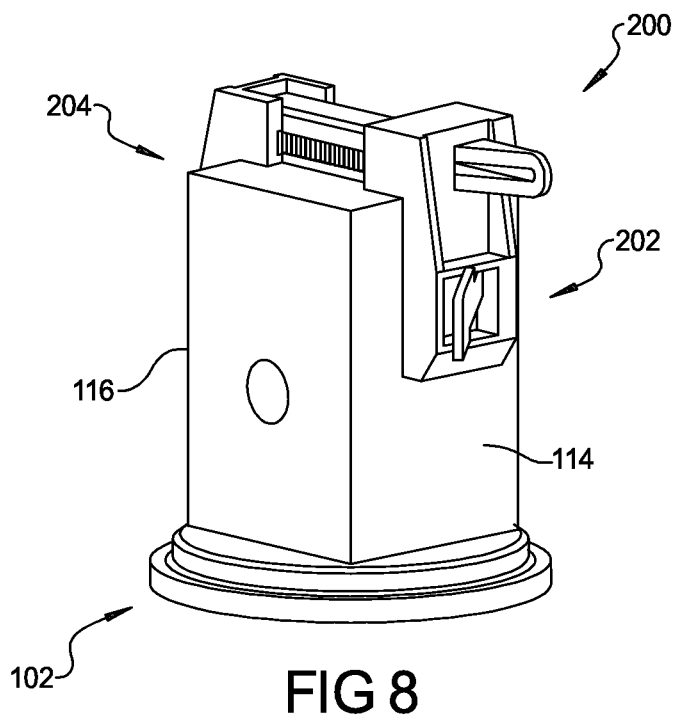

BATTERY CELL TERMINAL QUICK CONNECT CLAMP WITH CONNECTING TAB

CROSS-REFERENCE TO RELATED APPLICATIONS

This application claims the benefit of U.S. Provisional Application No. 61/716,745, filed on Oct. 22, 2012. The entire disclosure of the above application is incorporated herein by reference.

FIELD

The present disclosure relates to battery test systems and more particularly, to a quick connect clamp for attaching a battery tester lead to a battery cell terminal.

BACKGROUND

This section provides background information related to the present disclosure which is not necessarily prior art.

Uninterruptible power supply systems, such as those used for data centers and telecommunication systems, often utilize batteries as the source of back-up power, which will be referred to herein as a battery bank. Each battery bank is typically has multiple cells or multicell modules connected in series to provide the requisite voltage, commonly referred to as a battery string. The term "cell" or "battery cell" will be used herein to refer to both individual cells and multicell modules (sometimes term "monoblocs") of a battery string unless the context dictates otherwise. In should be understood that each battery cell in a battery string may itself include multiple electrochemical cells, such as when lead-acid batteries are used as the battery cells in a battery string. The individual battery cells adjacent to each other in a section of a battery string are connected to each other by a conductive connector, such as a copper bus bar, strap, cable or the like. This connector is commonly referred to as an intercell or intercell connector. Adjacent sections of a battery string are connected to each other by a longer conductive connector, such as a cable or group of cables (that are longer than cables used for intercell connectors), referred to as an intertier or intertier connector. The lead-acid batteries typically used for the battery cells have a capacity in the range of 25-4000 amp-hours.

Battery monitors are often used to monitor the battery banks in UPS systems. Currently, tab washers are used to attach the battery monitoring sense leads to the battery cell terminals. A tab washer is a washer that has a tab to which a connector of a battery monitoring lead can attach. Installing a tab washer on a battery terminal of a battery cell that is in service, such as a battery cell in a battery string of a battery bank back-up for a UPS, takes a significant amount of time. Each battery cell connection (such as the connection of each battery cell terminal to the associated intercell connector) must be disassembled, the tab washer installed, and the battery cell connection reassembled. Since large count battery strings may have 240 battery cells per battery string, and a battery bank back-up such as for UPS or telecommunication system can have multiple battery strings, it can be appreciated that installing all the tab washers requires a significant amount of time.

SUMMARY

This section provides a general summary of the disclosure, and is not a comprehensive disclosure of its full scope or all of its features.

In accordance with an aspect of the present disclosure a battery cell terminal quick connect clamp for attaching to a battery cell terminal has a conductive contact coupled to a connecting element to which a connector attached to the end of a battery monitoring lead can attach. The quick connect clamp includes a clamping mechanism that when in a clamped position presses the conductive contact against a side of the battery cell terminal. In an aspect, the connecting element is a tab and the connector attached to the end of the battery monitoring lead is a slip-on terminal.

In an aspect, the battery cell terminal quick connect clamp has a leg having the conductive contact disposed adjacent an inner surface of the leg and the clamping mechanism when in a clamped position presses the leg and thus the conductive contact against the side of the battery cell terminal.

In aspect, the battery cell terminal quick connect clamp includes a U-shaped base assembly having opposed legs moveable toward each other and a bight extending between the legs. One of the opposed legs is the leg having the conductive contact disposed adjacent its inner surface. The clamping mechanism when in the clamped position pressing the opposed legs against opposed sides of the battery cell terminal.

In an aspect, the base assembly includes a base and a slide member movably received in the base wherein the slide member comprises one of the opposed legs of the base assembly. The base has a bight portion that comprises the bight of the base assembly. The base has a leg at a first side of the base that extends perpendicularly from the bight portion wherein the leg of the base comprises the other opposed leg of the base assembly. A threaded shaft extends through a hole in the first side of the base across the bight portion and threadably engages a threaded hole in an upper portion of the slide member. Upon the clamping mechanism being moved toward the clamped position, the threaded shaft pulling the slide member toward the leg of the base to press the slide member and the leg of the base against opposed sides of the battery cell terminal.

In an aspect, a cam lever is affixed to an end of the threaded shaft and extends outwardly from the first side of the base. The cam lever comprises an over-the-center cam having a cam lobe abutting the first side the base and a lever member. The cam lever and threaded shaft are rotatable to tighten the threaded shaft in the threaded hole to bring the opposed legs light pressing engagement with the opposed sides of the battery cell terminal and the lever member movable from an open position to a closed position to rotate the cam lobe that further pulls with an over-the center camming action the threaded shaft outwardly to press the opposed legs against the opposed sides of the battery cell terminal.

In an aspect, the battery cell terminal quick connect clamp includes a ratcheting clamp having a ratchet member and a pawl member. The ratchet member has a leg and a finger extending perpendicularly from the leg with the finger of the ratchet member having a plurality of teeth. The pawl member has a leg and a finger extending perpendicularly from the leg. The pawl member has an opening with a pawl disposed therein. The ratchet member and the pawl member coacting to provide the clamping mechanism with the teeth of the finger of the ratchet member engageable with the pawl in the opening of the pawl member to hold the legs of the ratchet member and the pawl member in pressing engagement against opposed sides of the battery cell terminal when the ratchet member and pawl member are pushed together into a clamped position. In an aspect, an inner surface of the leg of the pawl member or the leg of the ratchet member has the conductive contact disposed adjacent thereto. In an aspect, the inner surfaces of the legs of both the ratchet member and the pawl member each have a conductive contact disposed adjacent thereto with each conductive contact coupled to a separate connecting element.

In an aspect, the finger of the ratchet member has a flat cross-section and the finger of the pawl member has a U-shaped cross-section in which the finger of the ratchet member ratchet member is received when the ratchet member and pawl member are pushed together into the clamped position.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 3 is a top view of the clamp of FIG. 1;

FIG. 4 is a front view of the clamp of FIG. 1;

FIG. 5 is a bottom view of the clamp of FIG. 1;

FIG. 6 is an end view of the base of the clamp of FIG. 1 taken from the left side of FIG. 2;

FIG. 7 is an end view of the slide member of the clamp of FIG. 1 taken from the left side of FIG. 2;

FIG. 8 is a perspective view of another quick connect clamp in accordance with an aspect of the present disclosure attached to a battery cell terminal;

Corresponding reference numerals indicate corresponding parts throughout the several views of the drawings.

DETAILED DESCRIPTION

Figure 1:
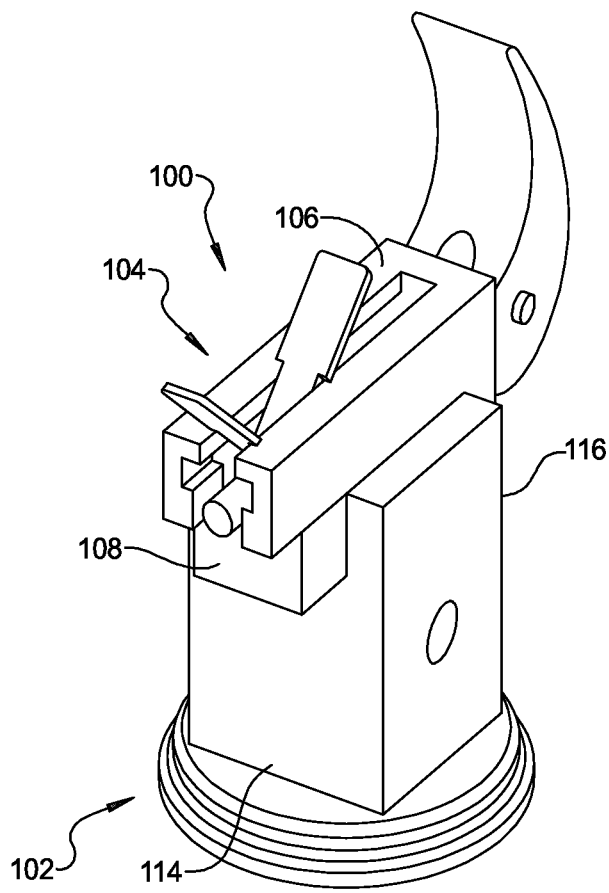
FIG. 1 is a perspective view of a quick connect clamp in accordance with an aspect of the present disclosure attached to a battery cell terminal.

Example embodiments will now be described more fully with reference to the accompanying drawings.

In accordance with an aspect of the present disclosure, a battery cell terminal quick connect clamp has a base assembly that fits over a terminal of a battery cell and has a portion that presses a conductive contact against the battery cell terminal. The conductive contact is coupled to a connecting element to which a battery monitor test lead can attach. In an aspect, the connecting element is a tab and an end of the battery monitor test lead has a slip-on terminal that mates with the tab.

In an aspect, the base assembly may be generally U-shaped having opposed legs and a bight extending between the legs. The base assembly includes a mechanism that presses the legs against the terminal of the battery cell. The base assembly includes the conductive contact disposed adjacent an inner surface of one of the legs that is pressed against the battery cell terminal when the legs are pressed against the battery cell terminal. In an aspect, there is a conductive contact disposed against an inner surface of each of the legs with each conductive contact coupled to a respective connecting element (which may be a tab). In an aspect, the conductive element may be coupled to a plurality of connecting elements.

With reference to FIGS. 1-7, in accordance with an aspect of the present disclosure, a battery terminal quick connect clamp 100 is shown attached to a terminal 102 (FIG. 1) of a battery cell (not shown). Clamp 100 includes base assembly 104 having a base 106 and a slide member 108 movably received in base 106. Base 106 may be L-shaped and as oriented in the drawings, with a horizontal portion 110 (which provides the bight of the U-shaped base assembly) and a leg 112 extending downwardly from horizontal portion 110. When clamp 100 is placed on battery cell terminal 102, leg 112 and slide member 108 extend down from horizontal portion 110 along opposed sides 114, 116 of battery cell terminal 102. It should be understood that slide member 108 and leg 112 comprise legs of the base assembly 104.

Figure 2:
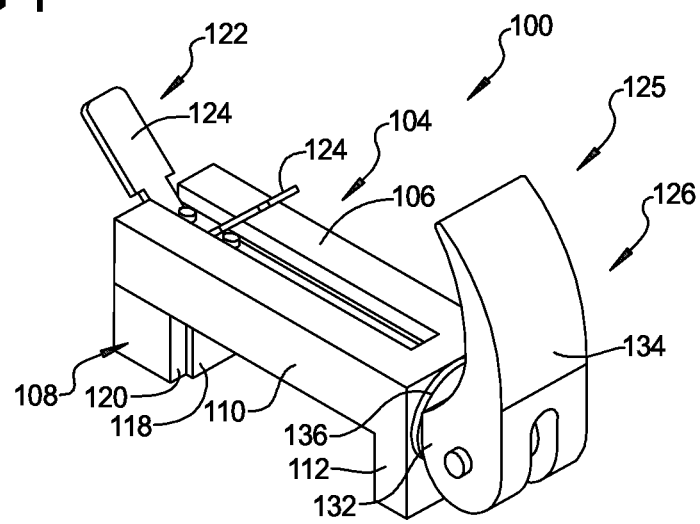
FIG. 2 is a perspective view of the clamp of FIG. 1.

A conductive contact 118 is disposed adjacent an inner surface 120 of slide member 108. Conductive contact 118 is coupled to connecting element 122, which in an aspect is a tab 124. It should be understood that conductive contact 118 and connecting element 122 may be separate pieces coupled together or may be integrally formed, such as a single stamped copper piece. It should also be understood that conductive contact 118 can be coupled to more than one connecting elements 122, such as to two (or more) tabs 124 as shown in FIG. 2. It should be understood that conductive contact may other configurations to accommodate other battery cell hardware or covers.

Base assembly 104 includes a clamping mechanism 125 that presses the legs against battery cell terminal 102. In the embodiment shown in FIGS. 1-7, clamping mechanism 125 includes a fastener 127 attached to an end 131 of threaded shaft 128 that extends through hole 129 (FIGS. 4 and 6) in base 106 and across horizontal portion 110 of base 106 and threadably engages a threaded hole 130 (FIGS. 4 and 7) of an upper portion 138 of slide member 108. In the embodiment shown in FIGS. 1-7, fastener 127 is a cam lever 126 which may illustratively be an over-the-center cam having cam lobe 132 abutting leg 112 of base 106 and lever member 134 projecting from cam lobe 132. A washer 136 may be disposed between cam lobe 132 and leg 112. As best shown in FIGS. 6 and 7, upper portion 138 of slide member 108 illustratively has opposed tongues 140 that are received in opposed grooves 142 (FIG. 6) in base 106. It should be understood that base 106 could have the tongues and upper portion 138 of slide member 108 could have the grooves.

To secure clamp 100 to battery cell terminal 102, base assembly 104 is placed over battery cell terminal 102 with slide member 108 and leg 112 of base 106 extending downwardly along opposed sides 114, 116 of battery cell terminal 102. Cam lever 126, with lever member 134 in the open position is rotated to tighten threaded shaft in threaded hole 130 of slide member 108 to pull slide member 108 toward leg 112 of base 106, such as until slide member 108 and leg 112 of base 106 are lightly pressed against opposed sides 114, 116 of battery cell terminal 102. Cam lever 126 is then moved to the closed position rotating cam lobe 132 to more forcefully pull slide member 108 toward leg 112 of base 106 and more forcefully press slide member 108 and leg 112 of base 106 against opposed sides 114, 116 of battery cell terminal 102. Since conductive contact 118 is disposed on inner surface 120 of slide member 108, this brings conductive contact 118 in conductive engagement with the applicable side 114, 116 of battery cell terminal 102. A conductive contact 118 can also (or alternatively) be disposed on an inner surface of leg 112 of base 106 (shown in phantom in FIG. 4), and would also be brought into conductive engagement with the applicable side 114, 116 of battery cell terminal 102 by this camming action of cam lever 126.

It should be understood that fastener 127 can be other than a cam lever, such as a nut, wing nut or the like attached to the end 131 of threaded shaft 128 that is tightened to pull slide member 108 and leg 112 of base 106 together and press them against opposed sides 114, 116 of battery cell terminal 102.

Figure 9:
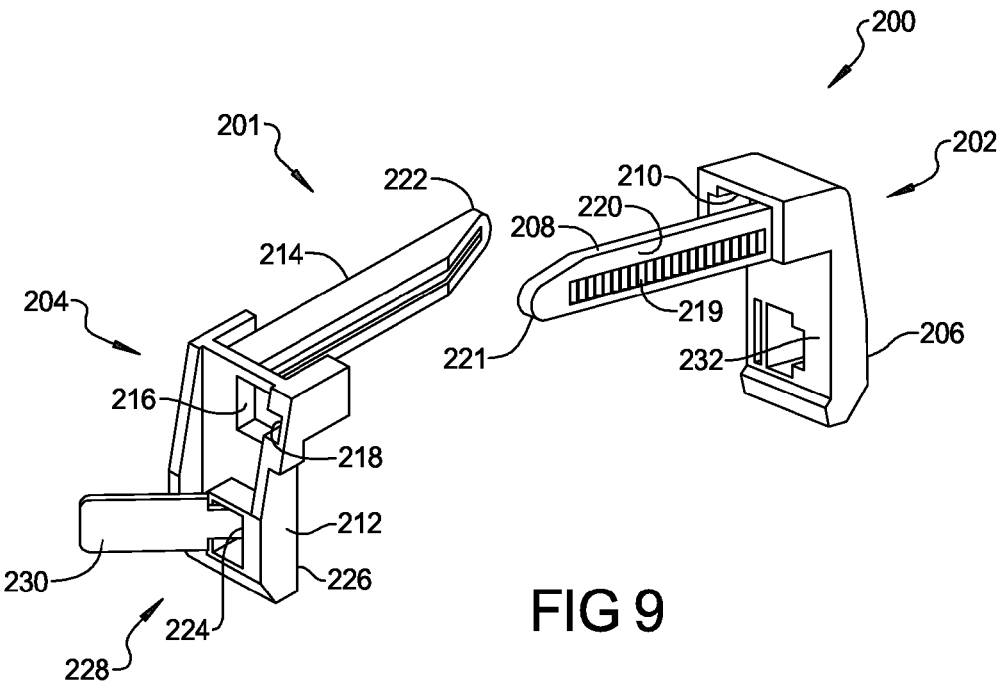
FIG. 9 is a perspective view of the clamp of FIG. 8 with the pawl and ratchet members disengaged from each other.

FIGS. 8 and 9 show another battery cell terminal quick connect clamp 200 in accordance with an aspect of the present disclosure. Clamp 200 is a ratcheting clamp having a ratchet member 202 and a pawl member 204. Ratchet member 202 includes a leg 206 and a finger 208 extending perpendicularly from leg 206. Ratchet member 202 includes an opening 210 at a junction of finger 208 and leg 206. Pawl member 204 includes a leg 212 and a finger 214 extending perpendicularly from leg 212 with an opening 216 at a junction of leg 212 and having a pawl 218 disposed at one side of opening 216. Finger 208 may illustratively have a flat cross-section and has a plurality of teeth 219 along a side 220 and has a tapered end 221. Finger 214 may illustratively have a U-shaped cross-section and includes a tapered end 222. Leg 212 of pawl member 204 includes a conductive contact 224 disposed on an inner side 226. Conductive contact 224 is coupled to a connecting element 228, which may illustratively be a tab 230. It should be understood that conductive contact 224 could be coupled to more than one connecting elements 228, such as to a plurality of tabs 230. It should also be understood that conductive contact 224 and associated connecting element (or elements) 228 could be disposed on an inner side 232 of leg 206 of ratchet member 202 and that each of ratchet member 202 and pawl member 204 could have a respective conductive contact 224 and associated connecting element (or elements) 228. Ratchet member 202 and pawl member 204 coact to provide clamping mechanism 201 that presses legs 206, 212 of ratchet member 202 and pawl member 204 against opposed sides of battery cell terminal 102, as discussed below.

To secure clamp 200 to battery cell terminal 102, ratchet member 202 and pawl member 204 are placed on opposed sides 114, 116 of battery cell terminal 102. Finger 208 of ratchet member 202 is inserted into opening 216 of pawl member 204 and finger 214 of pawl member 204 is inserted into opening 210 of ratchet member 202. Ratchet member 202 and pawl member 204 are pushed into a clamped position. Teeth 219 of finger 208 of ratchet member 202 ratchet past pawl 218 of pawl member 204 as ratchet member 202 and pawl member 204 are pushed together with pawl 218 engaging one of the teeth 219 of finger 208 to hold ratchet member 202 and pawl member 204 together in the clamp position press legs 206, 212 against opposite sides 114, 116 of battery cell terminal 102. This in turn presses conductive contact 224 against the applicable side 114, 116 of battery cell terminal 102.

Figure 10:
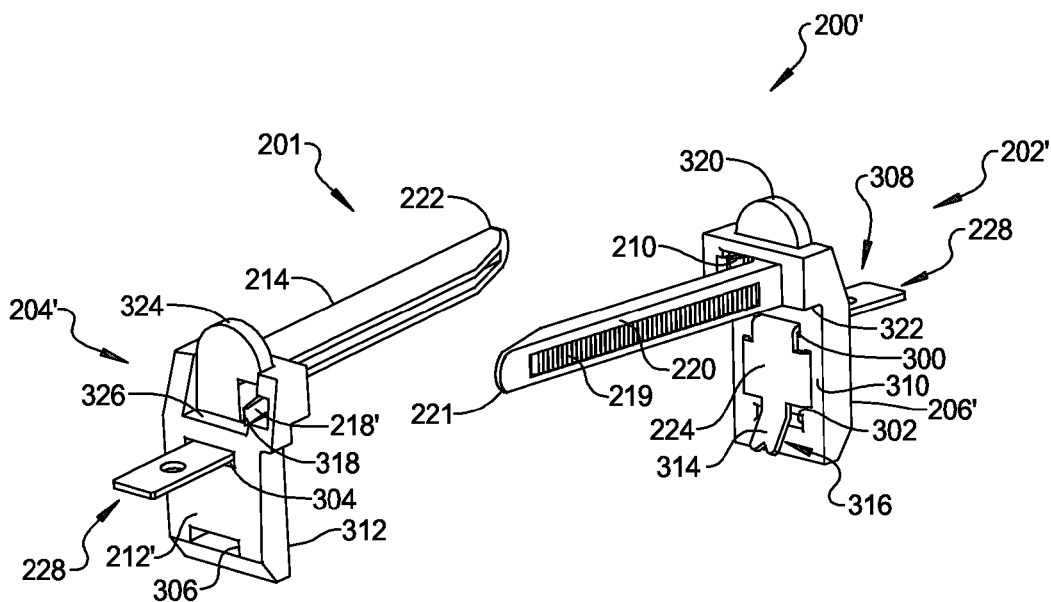
FIG. 10 is a perspective view of a variation of the quick connect clamp of FIGS. 8 and 9 with the pawl and ratchet members disengaged from each other.

FIG. 10 shows a battery cell terminal quick connect clamp 200' that is a variation of battery cell terminal quick connect 200 shown in FIGS. 8 and 9 and the discussion of battery cell terminal quick connect clamp 200' will focus on the differences from battery cell terminal quick connect clamp 200 shown in FIGS. 8 and 9. The leg 206' of ratchet member 202' has upper slot 300 and lower slot 302 therein. The leg 212' of pawl member 204' has upper slot 304 and lower slot 306 therein. Each of ratchet member 202' and pawl member 204' have a respective conductive contact 224 and associated connecting element 228 are illustratively integrally formed as a single L-shaped member 308, such as being stamped of a spring treated conductive material, such as spring treated copper. Connecting element 228, illustratively in the shape of a tab, extends horizontally (as oriented in FIG. 10) outwardly from the respective leg 206,' 212,' when L-shaped member is disposed in the respective leg 206,' 212' and conductive contact 224 extends downwardly along the respective inner side 310, 312 of respective leg 206,' 212.' Conductive contact 224 has an inwardly angled projection 314 at a lower end 316 (as oriented in FIG. 10). Inwardly angled projection 314 is pushed outwardly when ratchet member 202' and pawl member 204' are mated together and thus applies a spring force against the respective side 114, 116 of battery cell terminal 102. Pawl 218' includes a finger 318 that can be pressed to release pawl 218' from teeth 219 of finger 208 of ratchet member 202.' It should also be understood only one of ratchet member 202' and pawl member 204' could have piece 308 that provides conductive contact 224 and connecting element 228.

Upper and lower slots 300, 302 in leg 206' of ratchet member 202' allow piece 308 to be disposed in leg 206' of ratchet member 202' with connecting element 228 extending through upper slot 300 or lower slot 302. In the case of connecting element 228 extending through lower slot 302, conductive contact 224 extends upwardly (as oriented in FIG. 10) along inner side 310 of leg 206' of ratchet member 202.' The same is the case for pawl member 204' due to upper and lower slots 304, 306 in leg 212' of pawl member 204.'

Ratchet member 202' includes a tab 320, illustratively having a semi-circular shape, at a top 322 of leg 206.' Pawl member 204' has a similar tab 324 at a top 326 of leg 212.' Tabs 320, 324 provide surfaces against which a user can press when pressing ratchet member 202' and pawl member 204' together on battery cell terminal 202.

The foregoing description of the embodiments has been provided for purposes of illustration and description. It is not intended to be exhaustive or to limit the disclosure. It should be understood that the quick connect battery clamp can have configurations other than those shown for clamps 100, 200 in the figures. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:
1. A battery cell terminal quick connect clamp for attaching to a battery cell terminal, comprising:
 a leg having a conductive contact disposed adjacent an inner side of the leg, the conductive contact coupled to a connecting element to which a connector at an end of a batter monitoring lead is attachable;
 a clamping mechanism that in a clamped position presses the leg and thus the conductive contact against a side of the battery cell terminal;
 the clamping mechanism including a ratcheting clamp having a ratchet member and a pawl member, the ratchet member having a leg and a finger extending perpendicularly from the leg with the finger of the ratchet member having a plurality of teeth, the pawl member having a leg and a finger extending perpendicularly from the leg, the pawl member having an opening with a pawl disposed therein, the teeth of the finger of the ratchet member engageable with the pawl in the opening of the pawl member to hold the legs of the ratchet member and the pawl member in pressing engagement against opposed sides of the battery cell terminal when the ratchet member and pawl member are pushed together into a clamped position.

2. The battery cell terminal quick connect clamp of claim 1 wherein the finger of the ratchet member has a flat cross-section and the finger of the pawl member has a U-shaped cross-section in which the finger of the ratchet member is received when the ratchet member and pawl member are pushed together into the clamped position.

3. The battery cell terminal quick connect clamp of claim 1 wherein an inner side of the leg of the pawl member has the conductive contact disposed adjacent thereto.

4. The battery cell terminal quick connect clamp of claim 3 wherein an inner side of the leg of the ratchet member also has a conductive contact disposed adjacent thereto with that conductive contact coupled to a connecting element.

5. The battery cell terminal quick connect clamp of claim 1 wherein the leg of the ratchet member has upper and lower slots disposed therein and the leg of the pawl member has upper and lower slots disposed therein, the conductive contact and connecting element integrally formed as an L-shaped member wherein the connecting element extends through the upper or lower slot in the leg of the ratchet member with conductive contact extending along an inner side of the leg of the ratchet member or the connecting member extends through the upper or lower slot in the leg of the pawl member with the conductive contact extending along an inner side of the leg of the pawl member.

6. The battery cell terminal quick connect clamp of claim 5 including a second L-shaped member wherein the connecting element of one L-shaped member extends through the upper or lower slot in the leg of the ratchet member with the conductive contact of that L-shaped member extending along the inner side of the leg of the ratchet member and the connecting element of the other L-shaped member extends through the upper or lower slot in the leg of the pawl member with the conductive contact of the other L-shaped member extending along the inner side of the leg of the pawl member.

* * * * *

UNITED STATES PATENT AND TRADEMARK OFFICE
CERTIFICATE OF CORRECTION

| | | |
|---|---|---|
| PATENT NO. | : 9,083,038 B2 | Page 1 of 1 |
| APPLICATION NO. | : 14/049267 | |
| DATED | : July 14, 2015 | |
| INVENTOR(S) | : James R. Jones | |

It is certified that error appears in the above-identified patent and that said Letters Patent is hereby corrected as shown below:

Claims

Column 6,
Line 53, claim 1, delete "batter" and insert --battery--.

Signed and Sealed this
Fifth Day of April, 2016

Michelle K. Lee
*Director of the United States Patent and Trademark Office*